(12) United States Patent
Mochigi et al.

(10) Patent No.: US 10,854,388 B2
(45) Date of Patent: Dec. 1, 2020

(54) CERAMIC ELECTRONIC COMPONENT, METHOD OF PRODUCING THE SAME, AND ELECTRONIC COMPONENT MOUNTING SUBSTRATE

(71) Applicant: TAIYO YUDEN CO., LTD., Tokyo (JP)

(72) Inventors: Masaki Mochigi, Tokyo (JP); Kazuya Sato, Tokyo (JP); Yousuke Nakada, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/009,928

(22) Filed: Jun. 15, 2018

(65) Prior Publication Data

US 2019/0006103 A1 Jan. 3, 2019

(30) Foreign Application Priority Data

Jun. 29, 2017 (JP) .................................. 2017-127870

(51) Int. Cl.
*H01G 4/008* (2006.01)
*H01G 4/12* (2006.01)
(Continued)

(52) U.S. Cl.
CPC ............... *H01G 4/228* (2013.01); *H01G 2/06* (2013.01); *H01G 4/232* (2013.01); *H01G 4/30* (2013.01);
(Continued)

(58) Field of Classification Search
CPC ... H01B 1/14; H01B 1/16; H01B 1/22; H01B 13/0016; H01B 13/0026; H01G 2/06; H01G 4/228; H01G 4/232; H01G 4/30; H01G 4/008; H01G 4/012; H01G 4/1227; H01G 4/12; H01G 4/2325; H01R 4/02; H05K 1/11; H05K 1/181; H05K 1/18; H05K 3/3426; H05K 2201/10015; H05K 2201/10946; H05K 2201/2045
(Continued)

(56) References Cited

U.S. PATENT DOCUMENTS 4,953,273 A * 9/1990 Insetta ..................... H01G 2/06
29/25.42
6,027,008 A * 2/2000 Toi ....................... B23K 20/023
228/110.1
(Continued)

FOREIGN PATENT DOCUMENTS

JP 2014-229867 A 12/2014
JP 2015-062215 A 4/2015

OTHER PUBLICATIONS

Alloy Wire International pp. 1-3_Sep. 6, 2017.*

*Primary Examiner* — Timothy J Thompson
*Assistant Examiner* — Guillermo J Egoavil
(74) *Attorney, Agent, or Firm* — Saliwanchik, Lloyd & Eisenschenk

(57) ABSTRACT

A ceramic electronic component includes a ceramic body, a sintered metal film, and a metal terminal. The ceramic body includes internal electrodes. The sintered metal film has a joint surface having a surface roughness Ra of 0.200 μm or less. The sintered metal film is connected to the internal electrodes and formed on a surface of the ceramic body. The metal terminal is jointed to the joint surface.

4 Claims, 10 Drawing Sheets

(51) Int. Cl.
*H01G 4/228* (2006.01)
*H01G 4/30* (2006.01)
*H05K 1/11* (2006.01)
*H05K 1/18* (2006.01)
*H01G 4/232* (2006.01)
*H01G 2/06* (2006.01)
*H01G 4/012* (2006.01)
*H05K 3/34* (2006.01)

(52) U.S. Cl.
CPC ............ *H05K 1/11* (2013.01); *H01G 4/008* (2013.01); *H01G 4/012* (2013.01); *H01G 4/1227* (2013.01); *H05K 1/181* (2013.01); *H05K 3/3426* (2013.01); *H05K 2201/10015* (2013.01); *H05K 2201/10946* (2013.01); *H05K 2201/2045* (2013.01)

(58) Field of Classification Search
USPC .......................................... 174/260; 361/303
See application file for complete search history.

(56) References Cited

U.S. PATENT DOCUMENTS

| | | | | |
|---|---|---|---|---|
| 6,853,074 | B2* | 2/2005 | Kitae | H01L 24/10 |
| | | | | 257/690 |
| 9,786,434 | B2* | 10/2017 | Choi | H01G 2/06 |
| 2004/0042181 | A1* | 3/2004 | Nagasaki | H01L 35/08 |
| | | | | 361/725 |
| 2009/0296311 | A1* | 12/2009 | Otsuka | H01G 2/065 |
| | | | | 361/306.3 |
| 2010/0123995 | A1* | 5/2010 | Otsuka | H01G 4/232 |
| | | | | 361/308.1 |
| 2014/0329105 | A1* | 11/2014 | Nagamoto | H01B 13/0026 |
| | | | | 428/560 |
| 2015/0054388 | A1 | 2/2015 | Itagaki et al. | |
| 2015/0243439 | A1* | 8/2015 | Kwag | H01G 2/06 |
| | | | | 174/260 |
| 2016/0071778 | A1* | 3/2016 | Otsubo | H01L 23/29 |
| | | | | 257/687 |
| 2018/0240595 | A1* | 8/2018 | Shimura | H01G 4/30 |

* cited by examiner

CERAMIC ELECTRONIC COMPONENT, METHOD OF PRODUCING THE SAME, AND ELECTRONIC COMPONENT MOUNTING SUBSTRATE

CROSS-REFERENCE TO RELATED APPLICATION

This application claims the priority of Japanese Patent Application No. 2017-127870, filed Jun. 29, 2017, the disclosures of which are incorporated herein by reference in its entirety.

BACKGROUND

The present invention relates to a ceramic electronic component including a metal terminal, a method of producing the ceramic electronic component, and an electronic component mounting substrate.

A multi-layer ceramic capacitor includes a ceramic body in which a plurality of internal electrodes are disposed, and external electrodes that are formed on the surface of the ceramic body and connected to the internal electrodes. For example, the external electrodes are jointed to a mount substrate by solder or the like, and thus the multi-layer ceramic capacitor is mounted on the mount substrate.

In the case of a large-scale multi-layer ceramic capacitor or in the case where a ferroelectric material is used for the ceramic body, a mechanical strain of the ceramic body is transmitted to the mount substrate, and thus vibration noise is generated or cracks may be generated at joint portions with the mount substrate. Further, a heat cycle of the ceramic body may also cause a load on the joint portions.

There is known a multi-layer ceramic capacitor, in which metal terminals are attached to external electrodes in order to improve the reliability of the multi-layer ceramic capacitor with respect to the deformation of the ceramic body or the heat cycle after the multi-layer ceramic capacitor is mounted on a substrate (see, for example, Japanese Patent Application Laid-open Nos. 2014-229867 and 2015-62215).

SUMMARY

In order to improve the reliability of the multi-layer ceramic capacitor mounted on the substrate by using the metal terminals, high joint reliability is expected also in the external electrodes and the metal terminals.

In view of the circumstances as described above, it is desirable to provide a ceramic electronic component capable of improving joint reliability between an external electrode and a metal terminal, a method of producing the ceramic electronic component, and an electronic component mounting substrate.

According to an embodiment of the present invention, there is provided a ceramic electronic component including a ceramic body, a sintered metal film, and a metal terminal.

The ceramic body includes internal electrodes.

The sintered metal film has a joint surface having a surface roughness Ra of 0.200 μm or less, the sintered metal film being connected to the internal electrodes and formed on a surface of the ceramic body.

The metal terminal is jointed to the joint surface.

The joint surface having the surface roughness Ra in the above-mentioned range, from which deposited glass (glass surfacing), oxide films, dirt, and the like are removed, is smoothed. This can enhance joint reliability between the sintered metal film functioning as an external electrode and the metal terminal.

The ceramic electronic component may further include an alloy joint portion that is formed of an alloy having a melting point of 230° C. or higher and joints the joint surface and the metal terminal to each other.

This can inhibit a joint portion between the sintered metal film and the metal terminal from being melted by reflow when the ceramic electronic component is to be mounted on a mount substrate. Therefore, it is possible to further enhance the joint reliability between the sintered metal film and the metal terminal.

For example, the alloy may contain tin (Sn) as a main component and at least one of antimony (Sb), silver (Ag), copper (Cu), and nickel (Ni).

The ceramic body may have an end surface facing in one axis direction.

The sintered metal film may be formed on only the end surface.

This can inhibit the alloy joint portion from going around other parts when the metal terminal is jointed.

According to another embodiment of the present invention, there is provided an electronic component mounting substrate including a ceramic electronic component, a circuit substrate, and an alloy mount portion.

The ceramic electronic component is mounted on the circuit substrate.

The alloy mount portion is formed of a first alloy and joints the ceramic electronic component and the circuit substrate to each other.

The ceramic electronic component includes a ceramic body including internal electrodes, a sintered metal film, a metal terminal, and an alloy joint portion.

The sintered metal film has a joint surface having a surface roughness Ra of 0.200 μm or less, the sintered metal film being connected to the internal electrodes and formed on a surface of the ceramic body.

The metal terminal is jointed to the joint surface and jointed to the circuit substrate by the alloy mount portion.

The alloy joint portion is formed of a second alloy having a melting point higher than a melting point of the first alloy and joints the joint surface and the metal terminal to each other.

With this configuration, when the alloy mount portion formed of the first alloy is melted and the ceramic electronic component and the circuit substrate are jointed to each other, the second alloy can be inhibited from being melted because the second alloy has a higher melting point than a melting point of the first alloy.

The second alloy may have a melting point of 230° C. or higher.

Further, the second alloy may contain tin (Sn) as a main component and at least one of antimony (Sb), silver (Ag), copper (Cu), and nickel (Ni).

According to still another embodiment of the present invention, there is provided a method of producing a ceramic electronic component, the method including: sintering an electrode material applied to a surface of a ceramic body including internal electrodes and thus forming a sintered metal film connected to the internal electrodes; performing blasting on a surface of the sintered metal film; and jointing a metal terminal to the surface of the sintered metal film, the surface having been subjected to the blasting.

With this configuration, deposited glass (glass surfacing), oxide films, dirt, and the like are removed from the surface of the sintered metal film, and thus the surface of the sintered metal film can be smoothed. Therefore, it is possible to enhance joint reliability between the sintered metal film functioning as an external electrode and the metal terminal.

Further, since the blasting is performed with the ceramic body being fixed, collision of the ceramic bodies does not occur, and damages such as chipping are not caused. Furthermore, in the blasting, the same condition can be applied even if there are variations in shape of the elements, and unbalanced treatment can be inhibited from being performed on the elements.

Further, the sintered metal film and the metal terminal may be jointed to each other by using solder having a melting point of 230° C. or higher.

Furthermore, a region of the surface of the sintered metal film, the region facing in one axis direction, may be subjected to blasting.

The solder used for jointing the metal terminal can welt only the blasted portion. This can inhibit the solder from going around other parts.

In this case, the electrode material may be applied to an end surface of the ceramic body by printing, the end surface facing in the one axis direction, to form a sintered metal film.

This can form the sintered metal film on only the end surface facing in the one axis direction and can facilitate the blasting to be performed on only the surface of the sintered metal film, the surface facing in the one axis direction.

As described above, according to the present invention, it is possbile to provide a ceramic electronic component capable of improving joint reliability between an external electrode and a metal terminal, a method of producing the ceramic electronic component, and an electronic component mounting substrate.

These and other objects, features and advantages of the present invention will become more apparent in light of the following detailed description of embodiments thereof, as illustrated in the accompanying drawings.

DETAILED DESCRIPTION OF EMBODIMENTS

Hereinafter, embodiments of the present invention will be described with reference to the drawings.

In the figures, an X axis, a Y axis, and a Z axis orthogonal to one another are shown as appropriate. The X axis, the Y axis, and the Z axis are common in all figures. An X-axis direction corresponds to "one axis direction".

I. First Embodiment

1. Basic Configuration of Multi-layer Ceramic Capacitor 10

Figure 1:
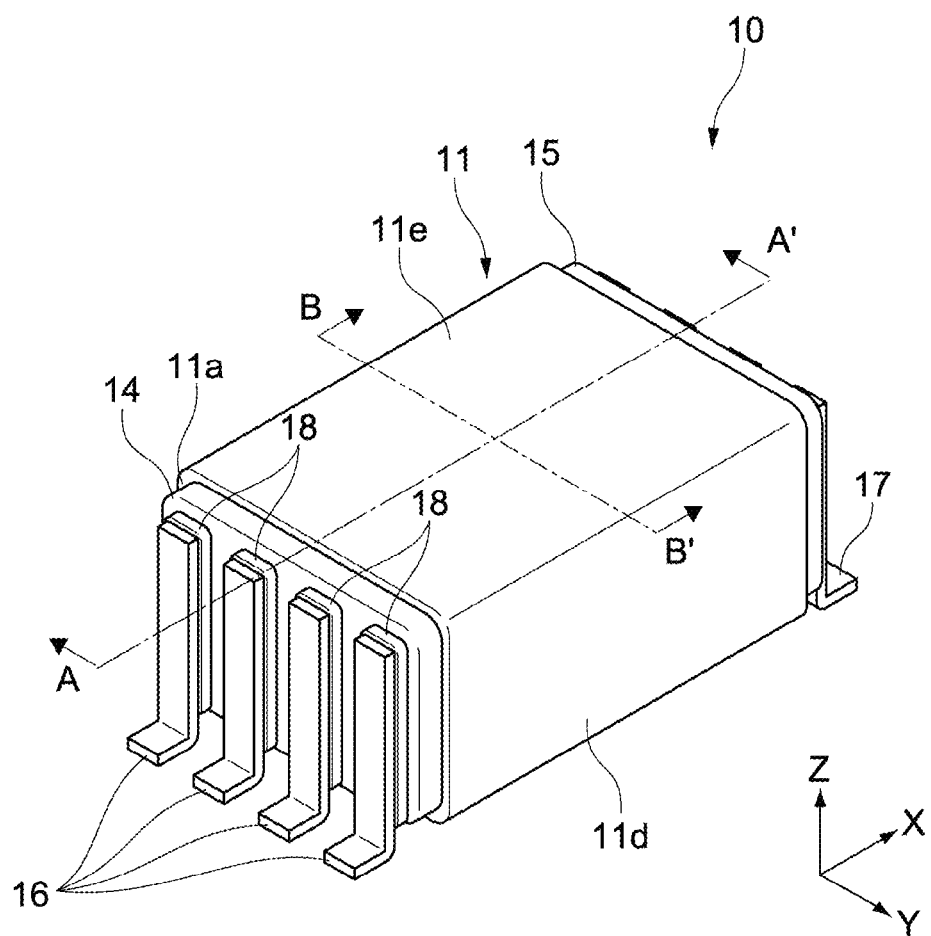
FIG. 1 is a perspective view of a multi-layer ceramic capacitor according to a first embodiment of the present invention.
Figure 2:
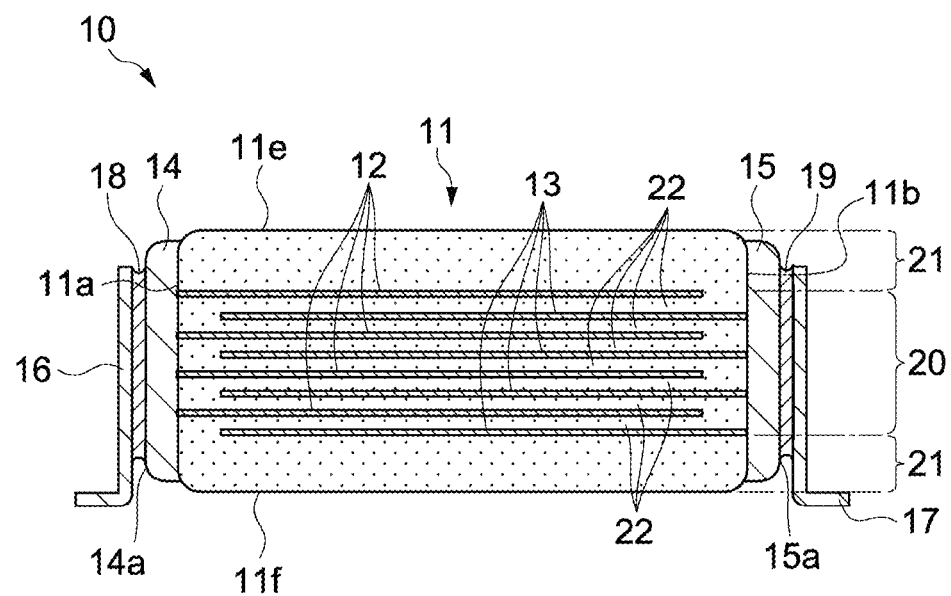
FIG. 2 is a cross-sectional view of the multi-layer ceramic capacitor taken along the A-A' line in FIG. 1.
Figure 3:
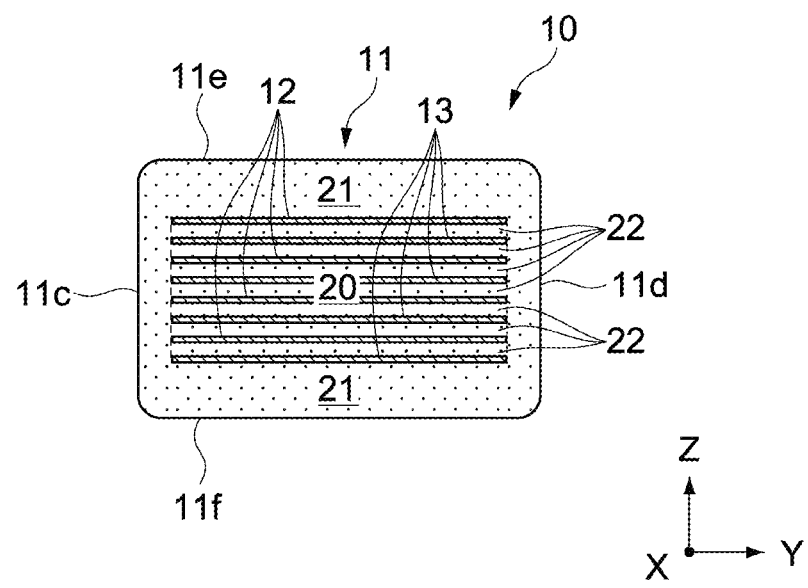
FIG. 3 is a cross-sectional view of the multi-layer ceramic capacitor taken along the B-B' line in FIG. 1.

FIGS. 1 to 3 each show a multi-layer ceramic capacitor 10 according to a first embodiment of the present invention. FIG. 1 is a perspective view of the multi-layer ceramic capacitor 10. FIG. 2 is a cross-sectional view of the multi-layer ceramic capacitor 10 taken along the A-A' line in FIG. 1. FIG. 3 is a cross-sectional view of the multi-layer ceramic capacitor 10 taken along the B-B' line in FIG. 1.

The multi-layer ceramic capacitor 10 includes a ceramic body 11, a first sintered metal film 14, a second sintered metal film 15, first metal terminals 16, second metal terminals 17, first alloy joint portions 18, and second alloy joint portions 19. The multi-layer ceramic capacitor 10 has a configuration in which the first and second sintered metal films 14 and 15 are formed on the surface of the ceramic body 11, and the first and second metal terminals 16 and 17 are jointed to the surfaces of the first and second sintered metal films 14 and 15 via the first and second alloy joint portions 18 and 19. The first and second sintered metal films 14 and 15 function as external electrodes of the multi-layer ceramic capacitor 10.

Typically, the ceramic body 11 has two end surfaces 11a and 11b facing in the X-axis direction, two side surfaces 11c and 11d facing in a Y-axis direction, and two main surfaces 11e and 11f facing in a Z-axis direction. The first and second sintered metal films 14 and 15 are formed on the end surfaces 11a and 11b, respectively. Ridges connecting the respective surfaces of the ceramic body 11 may be chamfered. The ceramic body 11 is configured such that, for example, the length along the X-axis direction is 3 mm or more, and the length along the Y-axis direction is 2 mm or more.

It should be noted that the ceramic body 11 does not need to have the rectangular shape as shown in FIGS. 1 to 3. For example, the surfaces of the ceramic body 11 may be curved surfaces, and the ceramic body 11 may be rounded as a whole.

The ceramic body 11 includes a capacitance forming unit 20 and protective portions 21. The capacitance forming unit 20 includes a plurality of ceramic layers 22, a plurality of first internal electrodes 12, and a plurality of second internal electrodes 13, thus having a laminated configuration of those layers and electrodes. The protective portions 21 cover the entire main surfaces of the capacitance forming unit 20 and the entire side surfaces thereof, the main surfaces facing in the Z-axis direction, the side surfaces facing in the Y-axis direction.

The first internal electrodes 12 and the second internal electrodes 13 are alternately disposed along the Z-axis direction between the ceramic layers 22 laminated in the Z-axis direction. The first internal electrodes 12 are drawn to the end surface 11a and apart from the end surface 11b. The second internal electrodes 13 are drawn to the end surface 11b and apart from the end surface 11a.

Typically, the first and second internal electrodes 12 and 13 mainly contain nickel (Ni) and function as internal electrodes of the multi-layer ceramic capacitor 10. It should be noted that the first and second internal electrodes 12 and 13 may contain at least one of copper (Cu), silver (Ag), and palladium (Pd) as a main component, other than nickel.

The ceramic layers 22 are formed of dielectric ceramics. In order to increase the capacitance of the capacitance forming unit 20, the ceramic layers 22 are formed of dielectric ceramics having a high dielectric constant.

For the dielectric ceramics having a high dielectric constant, polycrystal of a barium titanate ($BaTiO_3$) based material, i.e., polycrystal having a Perovskite structure containing barium (Ba) and titanium (Ti) is used. This provides the multi-layer ceramic capacitor 10 with a large capacitance.

It should be noted that the ceramic layers 22 may be formed of a strontium titanate ($SrTiO_3$) based material, a calcium titanate ($CaTiO_3$) based material, a magnesium titanate ($MgTiO_3$) based material, a calcium zirconate ($CaZrO_3$) based material, a calcium zirconate titanate ($Ca(Zr,Ti)O_3$) based material, a barium zirconate ($BaZrO_3$) based material, a titanium oxide ($TiO_2$) based material, or the like.

The protective portions 21 are also formed of dielectric ceramics. The material of the protective portions 21 only needs to be insulating ceramics, but use of the dielectric ceramics similar to the dielectric ceramics of the ceramic layers 22 leads to suppression of internal stress in the ceramic body 11.

The protective portions 21 cover the surfaces of the capacitance forming unit 20 other than both the end surfaces facing in the X-axis direction. The protective portions 21 have the main functions of protecting the periphery of the capacitance forming unit 20 and ensuring insulation properties of the first and second internal electrodes 12 and 13.

Hereinafter, regions of the protective portions 21 on the main surfaces 11e and 11f side are referred to as cover regions, and regions of the protective portions 21 on the side surfaces 11c and 11d side are referred to as side margin regions.

The first and second sintered metal films 14 and 15 function as external electrodes of the multi-layer ceramic capacitor 10 and are formed on the end surfaces 11a and 11b of the ceramic body 11, respectively. The first sintered metal film 14 is connected to the first internal electrodes 12, which are drawn to the end surface 11a. The second sintered metal film 15 is connected to the second internal electrodes 13, which are drawn to the end surface 11b. The first and second sintered metal films 14 and 15 respectively include joint surfaces 14a and 15a formed to face in the X-axis direction.

Figure 8:
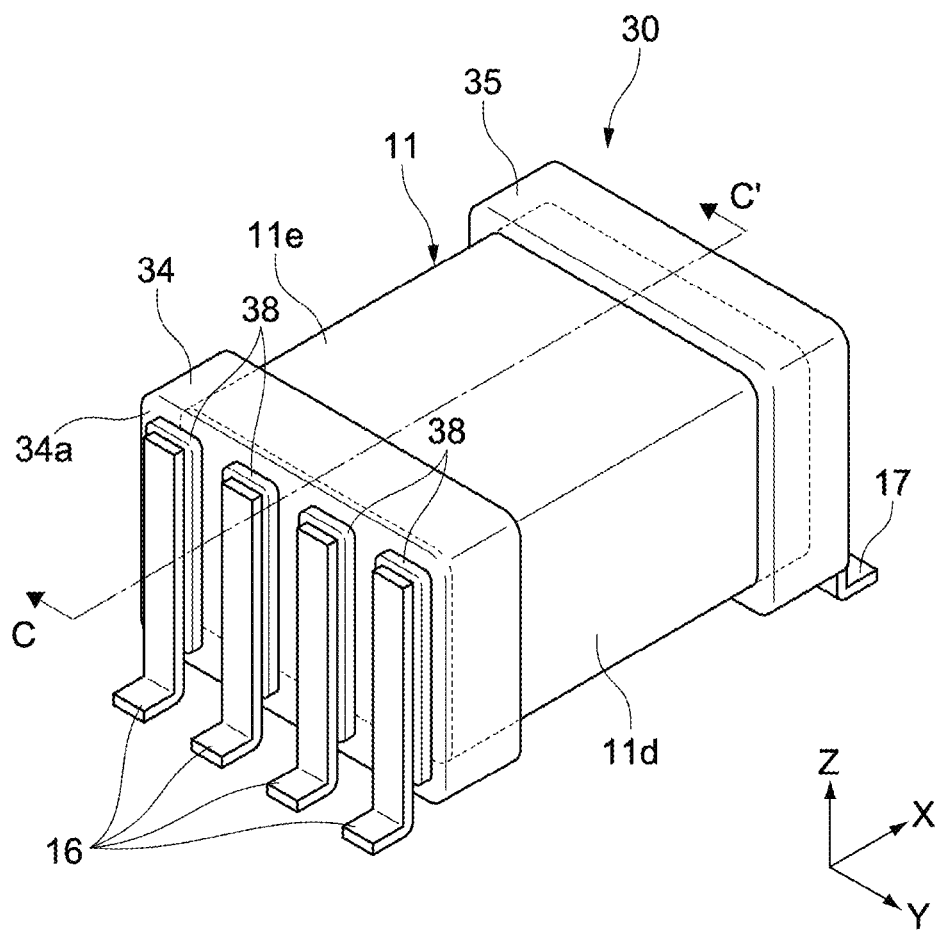
FIG. 8 is a perspective view of a multi-layer ceramic capacitor according to a modified example of the embodiment.
Figure 9:
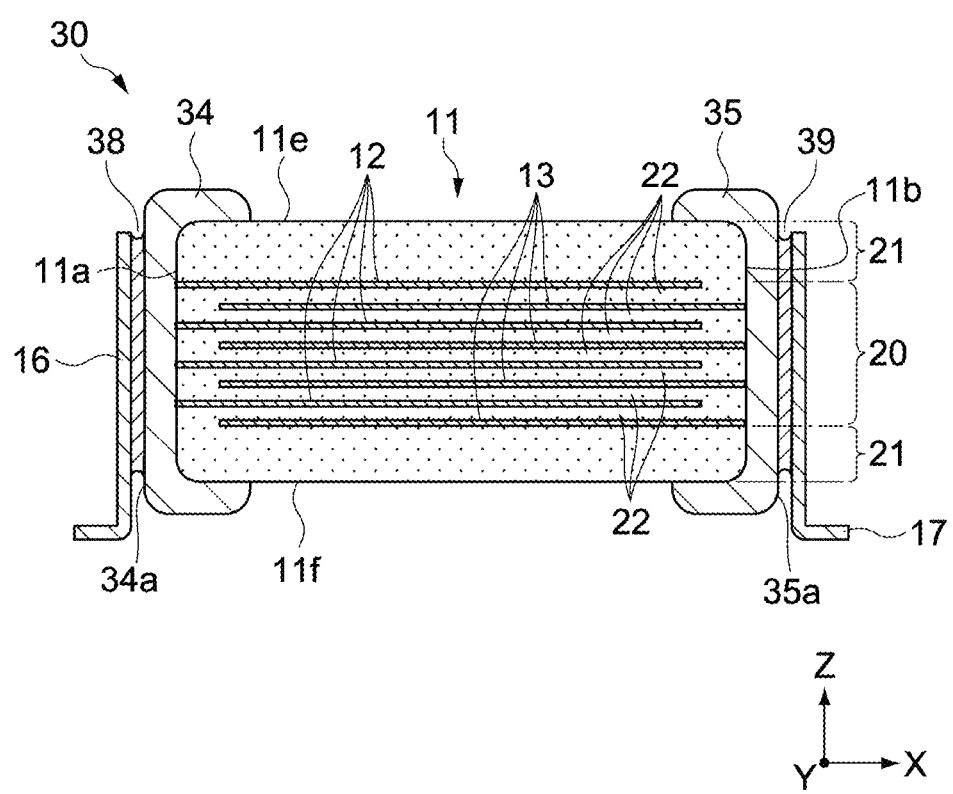
FIG. 9 is a cross-sectional view of the multi-layer ceramic capacitor taken along the C-C' line of FIG. 8.

The first and second sintered metal films 14 and 15 are formed on only the end surfaces 11a and 11b, for example. This can easily inhibit the first and second alloy joint portions 18 and 19 from going around other parts excluding the joint surfaces 14a and 15a. The first and second alloy joint portions 18 and 19 will be described later. Alternatively, as shown in FIGS. 8 and 9 that will be described later, the first and second sintered metal films 14 and 15 may cover the end surfaces 11a and 11b and also extend to the side surfaces 11c and 11d and the main surfaces 11e and 11f.

The first and second sintered metal films 14 and 15 are sintered films on which an electrical conductive paste mainly containing metal such as nickel (Ni) or copper (Cu) is baked. The first and second sintered metal films 14 and 15 contain, in addition to the main component, glass derived from the electrical conductive paste, or the like. It should be noted that the first and second sintered metal films 14 and 15 may contain, other than nickel and copper, at least one of silver (Ag) and palladium (Pd) as a main component.

With the configuration described above, when a voltage is applied between the first and second sintered metal films 14 and 15 via the first and second metal terminals 16 and 17 in the multi-layer ceramic capacitor 10, the voltage is applied to the plurality of ceramic layers 22 between the first and second internal electrodes 12 and 13. Thus, the multi-layer ceramic capacitor 10 stores charge corresponding to the voltage applied between the first and second sintered metal films 14 and 15.

The first and second metal terminals 16 and 17 are terminals for mounting the multi-layer ceramic capacitor 10 on a mount substrate or the like. For example, the first and second metal terminals 16 and 17 are configured as plate-like lead frames. The first metal terminals 16 are jointed to the joint surface 14a of the first sintered metal film 14 and arrayed on the joint surface 14a along the Y-axis direction. The second metal terminals 17 are jointed to the joint surface 15a of the second sintered metal film 15 and arrayed on the joint surface 15a along the Y-axis direction. The first and second metal terminals 16 and 17 are illustrated in the shape extending in the Z-axis direction from the portions jointed to the first and second sintered metal films 14 and 15 and also bent outward in the X-axis direction. However, the first and second metal terminals 16 and 17 are not limited to this configuration as long as the multi-layer ceramic capacitor 10 can be properly mounted on the mount substrate. Further, the number of first and second metal terminals 16 and 17 is not limited to the example shown in the figures.

The first and second metal terminals 16 and 17 are formed of a metal material mainly containing, for example, copper (Cu), nickel (Ni), iron (Fe), or chromium (Cr), or of an alloy containing those metals. The first and second metal terminals 16 and 17 may not be subjected to plating or may be subjected to plating, for example.

The first alloy joint portions 18 joint the joint surface 14a and the metal terminals 16 to each other. The second alloy joint portions 19 joint the joint surface 15a and the metal terminals 17 to each other. Each of the first alloy joint portions 18 is formed so as to correspond to each of the first metal terminals 16. Each of the second alloy joint portions 19 is formed so as to correspond to each of the second metal terminals 17. The shape of the first and second alloy joint portions 18 and 19 is not particularly limited. The first alloy joint portions 18 may be formed between the first metal terminals 16 and the first sintered metal film 14, and the second alloy joint portions 19 may be formed between the second metal terminals 17 and the second sintered metal film 15. Alternatively, the first alloy joint portions 18 may be formed so as to cover the ends of the first metal terminals 16, and the second alloy joint portions 19 may be formed so as to cover the ends of the second metal terminals 17.

The first and second alloy joint portions 18 and 19 are formed of solder having a melting point of, for example, 230° C. or higher. Such solder is referred to as high-temperature solder. Examples of the high-temperature solder include, specifically, an alloy containing tin (Sn) as a main component and at least one of antimony (Sb), silver (Ag), copper (Cu), and nickel (Ni). Examples of such an alloy include an Sn—Sb based alloy, an Sn—Ag—Cu based alloy, and an Sn—Cu—Ni based alloy. Use of the high-temperature solder can inhibit the occurrence of a defect such as melting of the solder of the first and second alloy joint portions 18 and 19 in the reflow for the mount substrate.

It should be noted that the material of the first and second alloy joint portions 18 and 19 is not limited to the high-temperature solder and may be a brazing material formed of an alloy mainly containing gold (Au), silver (Ag), copper (Cu), zinc (Zn), aluminum (Al), or the like.

Figure 4:
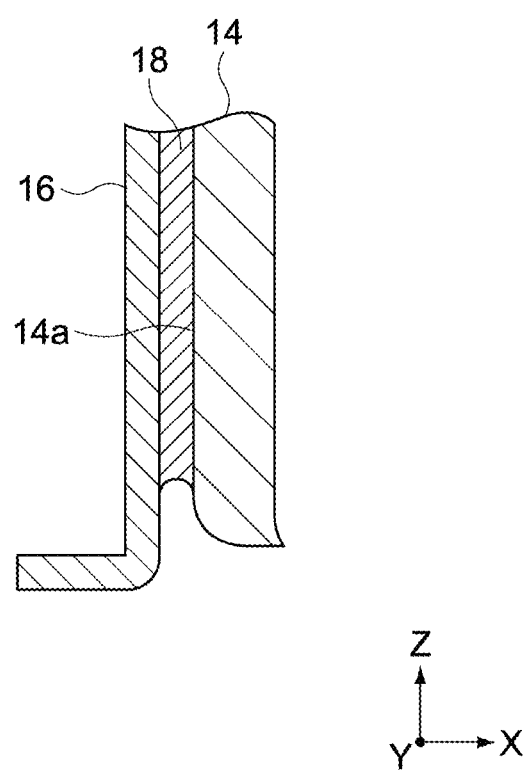
FIG. 4 is a partially enlarged view of FIG. 2.

FIG. 4 is an enlarged view of FIG. 2 and shows a joint portion between the first metal terminal 16 and the first sintered metal film 14. It should be noted that a joint portion between the second metal terminal 17 and the second sintered metal film 15 is also formed in the same manner.

As shown in the figure, in the multi-layer ceramic capacitor 10, the metal terminal 16 is directly jointed to the first sintered metal film 14 by solder.

The joint surfaces 14a and 15a to which the first and second metal terminals 16 and 17 are jointed have a surface roughness Ra of 0.200 μm or less. After baking, the surfaces of the first and second sintered metal films 14 and 15 undergo glass surfacing in which glass contained in the electrical conductive paste of the first and second sintered metal films 14 and 15 is deposited, or asperities resulting from an oxide film and the like. In this case, the surface roughness Ra is larger than 0.200 μm. Those asperities reduce the wettability of the solder and also reduce the joint reliability between the first sintered metal film 14 and the first metal terminals 16 and between the second sintered metal film 15 and the second metal terminals 17.

Therefore, in order to make the surface roughness Ra of the joint surfaces 14a and 15a equal to or smaller than 0.200 μm, the first and second sintered metal films 14 and 15 are subjected to surface treatment, and the asperities described above are removed. This enables the wettability of the solder of the first and second alloy joint portions 18 and 19 to be properly controlled, so that the joint reliability between the first and second sintered metal films 14 and 15 and the first and second metal terminals 16 and 17 can be improved.

2. Method of Producing Multi-layer Ceramic Capacitor 10

Figure 5:
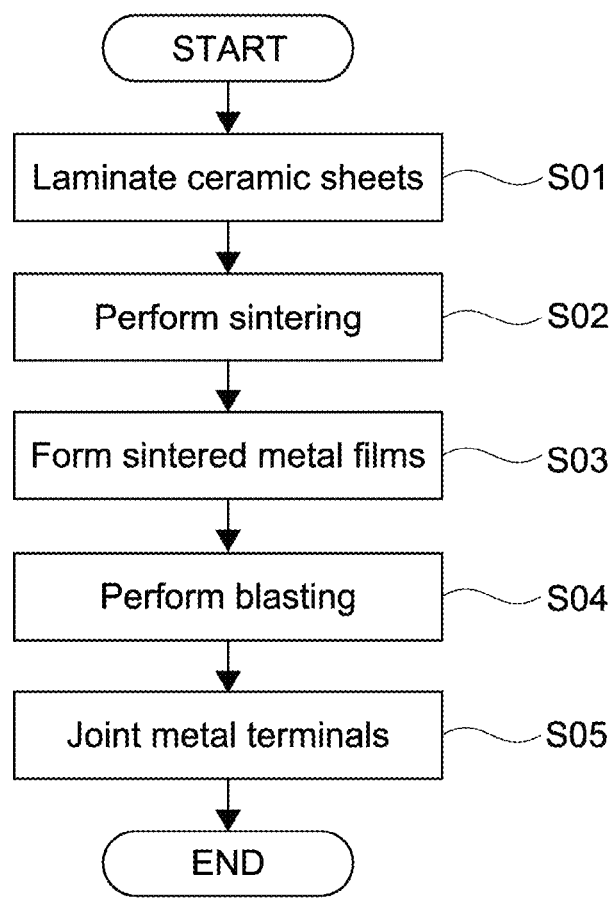
FIG. 5 is a flowchart showing a method of producing the multi-layer ceramic capacitor.
Figure 6:
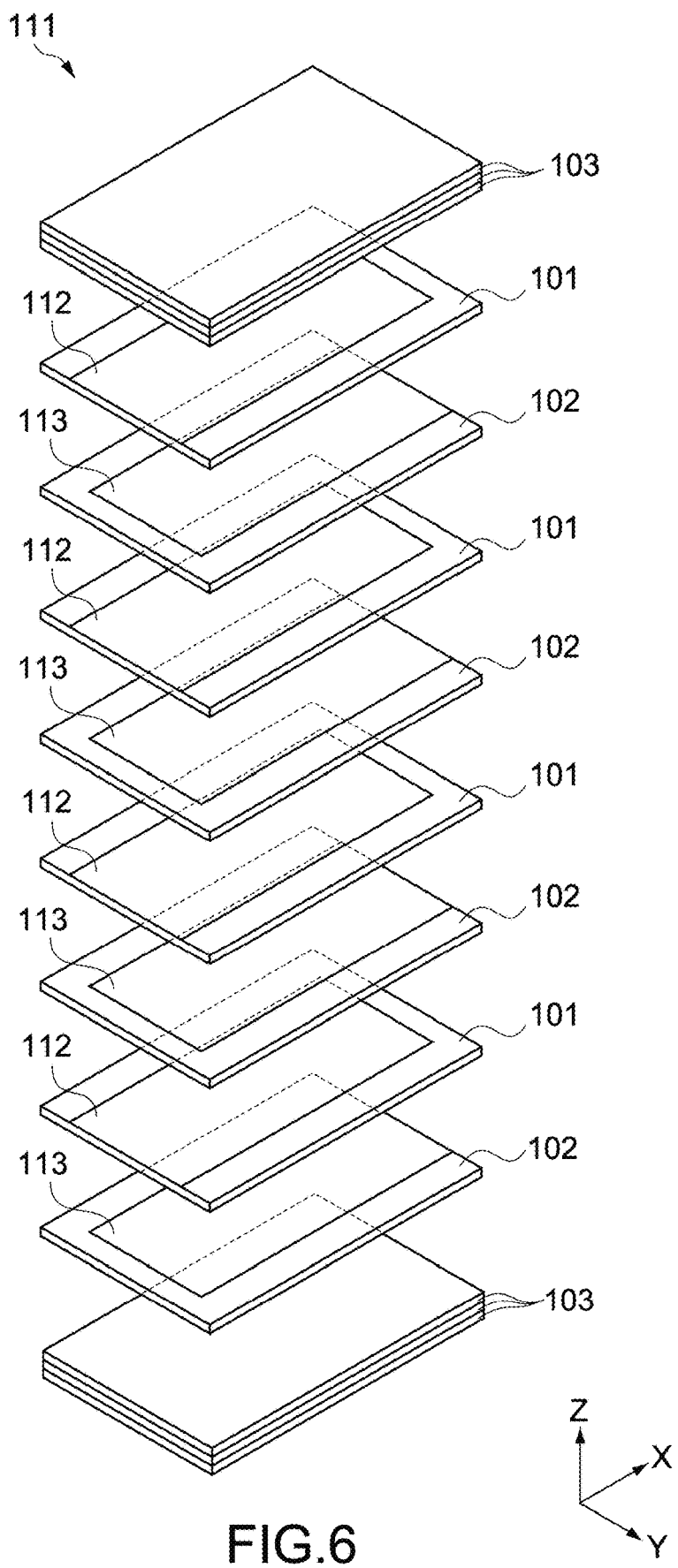
FIG. 6 is an exploded perspective view showing a production process of the multi-layer ceramic capacitor.
Figure 7:
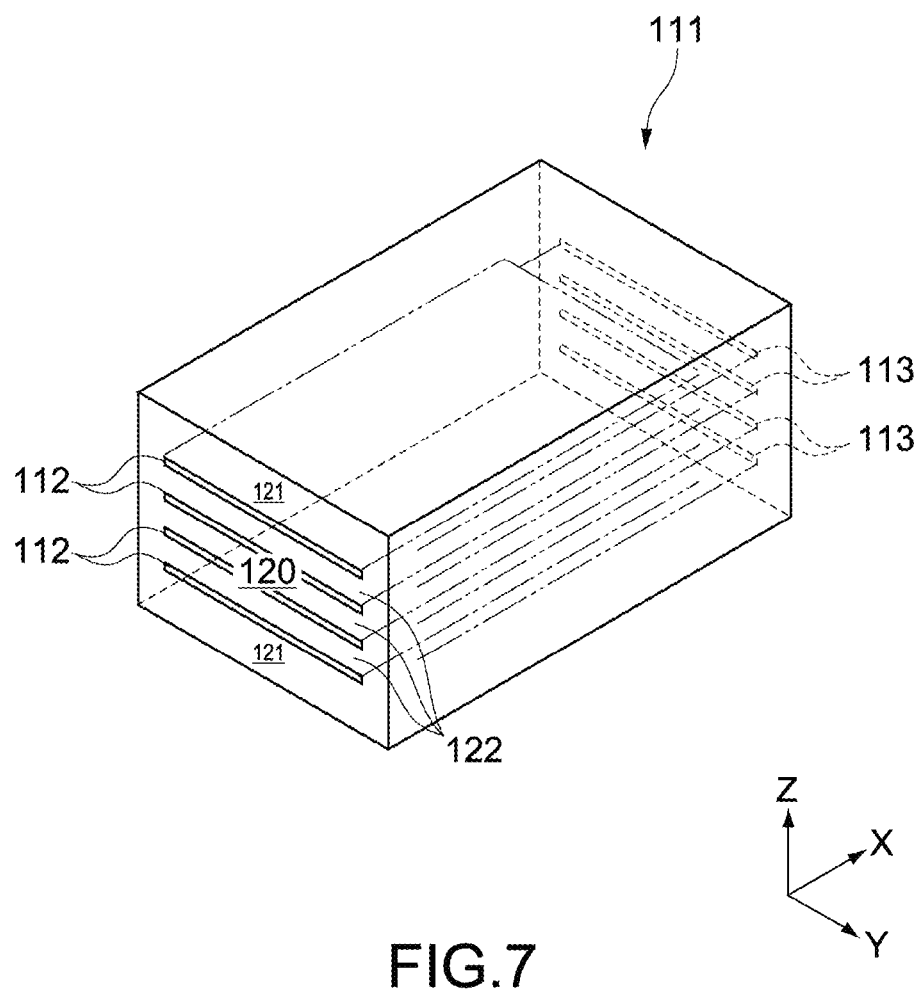
FIG. 7 is a perspective view showing a production process of the multi-layer ceramic capacitor.

FIG. 5 is a flowchart showing a method of producing the multi-layer ceramic capacitor 10. FIGS. 6 and 7 are views each showing a production process of the multi-layer ceramic capacitor 10. Hereinafter, the method of producing the multi-layer ceramic capacitor 10 will be described along FIG. 5 with reference to FIGS. 6 and 7 as appropriate.

2.1 Step S01: Lamination of Ceramic Sheets

In Step S01, first ceramic sheets 101 and second ceramic sheets 102 for forming the capacitance forming unit 20, and third ceramic sheets 103 for forming the cover regions of the protective portions 21 are prepared. As shown in FIG. 6, those first, second, and third ceramic sheets 101, 102, and 103 are laminated to produce an unsintered ceramic body 111.

The first, second, and third ceramic sheets 101, 102, and 103 are configured as unsintered dielectric green sheets mainly containing dielectric ceramics. The first, second, and third ceramic sheets 101, 102, and 103 are formed into a sheet shape by using a roll coater or a doctor blade, for example. The thickness of the first, second, and third ceramic sheets 101, 102, and 103 is adjustable as appropriate.

As shown in FIG. 6, unsintered first internal electrodes 112 corresponding to the first internal electrodes 12 are formed on the first ceramic sheets 101, and unsintered second internal electrodes 113 corresponding to the second internal electrodes 13 are formed on the second ceramic sheets 102. It should be noted that no internal electrodes are formed on the third ceramic sheets 103 corresponding to the cover regions of the protective portions 21.

The first and second internal electrodes 112 and 113 can be formed by applying any electrical conductive paste to the first and second ceramic sheets 101 and 102. A method of applying the electrical conductive paste can be arbitrarily selected from well-known techniques. For example, for the application of the electrical conductive paste, a screen printing method or a gravure printing method can be used.

In the unsintered ceramic body 111 shown in FIG. 6, the first and second ceramic sheets 101 and 102 are alternately laminated. On the upper and lower surfaces of the laminate in the Z-axis direction, the third ceramic sheets 103 corresponding to the cover regions are laminated. It should be noted that the number of first, second, and third ceramic sheets 101, 102, and 103 is not limited to the number of the example shown in FIG. 6.

The unsintered ceramic body 111 is integrated by pressure-bonding of the first, second, and third ceramic sheets 101, 102, and 103. For the pressure-bonding of the first, second, and third ceramic sheets 101, 102, and 103, for example, hydrostatic pressing or uniaxial pressing is desirably used. With this configuration, a high-density ceramic body 111 can be obtained.

FIG. 7 is a perspective view of the unsintered ceramic body 111 obtained in Step S01. The unsintered ceramic body 111 includes a capacitance forming unit 120 in which the first and second internal electrodes 112 and 113 are alternately laminated between ceramic layers 122 and are exposed to both the end surfaces in the X-axis direction. The unsintered ceramic body 111 includes protective portions 121 in the periphery of the capacitance forming unit 120, in which the first and second internal electrodes 112 and 113 are not exposed from both the side surfaces facing in the Y-axis direction and both the main surfaces facing in the Z-axis direction.

It should be noted that the unsintered ceramic body 111 corresponding to the single ceramic body 11 has been described above, but actually, a laminated sheet, which is a large-sized sheet and is not singulated, is formed and then singulated into the ceramic bodies 111.

2.2 Step S02: Sintering

In Step S02, the unsintered ceramic body 111 obtained in Step S01 is sintered, to produce the ceramic body 11 shown in FIGS. 1 to 3. In other words, in Step S02, the capacitance forming unit 120 becomes the capacitance forming unit 20, and the protective portions 121 become the protective portions 21.

A sintering temperature in Step S02 can be determined on the basis of a sintering temperature for the ceramic body 111. For example, when a barium titanate based material is used as the dielectric ceramics, the sintering temperature can be set to approximately 1,000 to 1,300° C. Further, sintering can be performed in a reduction atmosphere or a low-oxygen partial pressure atmosphere, for example.

2.3 Step S03: Formation of Sintered Metal Films

In Step S03, the first and second sintered metal films 14 and 15 are formed on the surfaces of the ceramic body 11 obtained in Step S02.

More specifically, in Step S03, first, an unsintered electrode material is applied to both the end surfaces 11a and 11b of the ceramic body 11. Examples of the electrode material include an electrical conductive paste containing metal powder of nickel (Ni), copper (Cu), or the like, glass powder, and the like.

For an application method, a screen printing method or a roll transfer method can be used. Thus, the electrode material can be applied to only the end surfaces 11a and 11b.

Alternatively, a dip coating method may be used. Thus, the electrode material can be applied so as to cover both the end surfaces 11a and 11b. In this case, the electrode material may adhere to not only both the end surfaces 11a and 11b but also both the side surfaces 11c and 11d and both the main surfaces 11e and 11f.

The unsintered electrode material thus applied is sintered in a reduction atmosphere or a low-oxygen partial pressure atmosphere, for example. Thus, the first and second sintered metal films 14 and 15 connected to the first and second internal electrodes 12 and 13 are formed.

2.4 Step S04: Blasting

In Step S04, the joint surfaces 14a and 15a of the first and second sintered metal films 14 and 15, which face in the X-axis direction, are subjected to blasting, and thus the surface roughness Ra of the joint surfaces 14a and 15a is set to 0.200 μm or less. For the blasting, sandblasting, wet blasting, or the like can be used. In sandblasting, for example, the ceramic body 11 on which the first and second sintered metal films 14 and 15 are formed is retained in a holder or the like, and injection media is sprayed to the joint surfaces 14a and 15a at a predetermined injection pressure. For the injection media, $Al_2O_3$ can be used as an example.

2.5 Step S05: Joint of Metal Terminals

In Step S05, the first and second metal terminals 16 and 17 are jointed to the joint surfaces 14a and 15a of the first and second sintered metal films 14 and 15.

First, the first and second metal terminals 16 and 17 are prepared. Each of the first and second metal terminals 16 and 17 is, for example, a lead frame having a desired shape. The number of first and second metal terminals 16 and 17 is not particularly limited.

Subsequently, the first and second metal terminals 16 and 17 are respectively jointed to the joint surfaces 14a and 15a by using solder for jointing terminals. The solder for jointing terminals is to be changed to the first and second alloy joint portions 18 and 19. The solder for jointing terminals is applied to each of the first and second metal terminals 16 and 17.

For the solder, the high-temperature solder having a melting point of, for example, 230° C. or higher is used. Thus, when the multi-layer ceramic capacitor 10 is mounted on the mount substrate by using the first and second metal terminals 16 and 17, it is possible to inhibit the first and second alloy joint portions 18 and 19 from being melted by reflow.

As described above, the multi-layer ceramic capacitor 10 shown in FIGS. 1 to 3 is produced.

3. Actions and Effects

The multi-layer ceramic capacitor 10 as described above can enhance the joint strength of the first and second metal terminals 16 and 17 with respect to the first and second sintered metal films 14 and 15.

After the baking, the surfaces of the first and second sintered metal films 14 and 15 undergo glass surfacing in which glass contained in the electrical conductive paste is deposited on the surfaces. This reduces the wettability of the solder and hinders the joint strength from being sufficiently obtained when the first and second metal terminals 16 and 17 are jointed by solder. Further, oxide films, dirt, and the like adhere to the surfaces of the first and second sintered metal films 14 and 15 in some cases. This may also reduce the joint strength.

In this regard, in this embodiment, blasting is performed on the surfaces of the first and second sintered metal films 14 and 15. Thus, the glass deposited on the surfaces, the oxide films, dirt, and the like are removed, and the joint surfaces 14a and 15a are smoothed. The joint surfaces 14a and 15a are smoothed so as to have the surface roughness Ra of 0.200 μm or less, so that the wettability of the solder can be improved and the joint strength can be enhanced.

Since the blasting is performed with the ceramic body 11 being fixed, collision of the ceramic bodies 11 does not occur as in the case of barrel polishing, and damages such as chipping are not caused. Furthermore, since injection media is sprayed to the joint surfaces 14a and 15a in the blasting, the same condition can be applied even if there are variations in shape of the elements, and unbalanced treatment can be inhibited from being performed on the elements. Furthermore, using a mask enables blasting to be performed on only the joint surfaces 14a and 15a.

In a general multi-layer ceramic capacitor, an external electrode includes a base film as a sintered metal film, and a plurality of plating films formed on the base film by wet plating or the like. Metal terminals are then jointed to the plating films. However, the bodies may collide with one another and may be damaged by barrel plating generally used as wet plating, or the like.

On the other hand, in the multi-layer ceramic capacitor 10 of this embodiment, plating films are not formed, and the first and second sintered metal films 14 and 15, which are generally used as base films, are used as external electrodes. In other words, wet plating is not performed on the first and second sintered metal films 14 and 15, and the first and second metal terminals 16 and 17 are directly jointed thereto. Thus, collision of the bodies, which occurs by, for example, barrel plating generally used as wet plating, can be inhibited, and damages such as chipping to the ceramic body 11 can be inhibited from occurring. In particular, in the case where the ceramic body 11 has a larger size, energy by the collision becomes larger. For that reason, the technology of this embodiment is suitably used.

4. Modified Example

FIGS. 8 and 9 are views of a multi-layer ceramic capacitor 30 according to a modified example of this embodiment. FIG. 8 is a perspective view of the multi-layer ceramic capacitor 30 and corresponds to FIG. 1. FIG. 9 is a cross-sectional view of the multi-layer ceramic capacitor 30 taken along the C-C' line of FIG. 8, which corresponds to FIG. 2. As shown in those figures, first and second sintered metal films 34 and 35 of the multi-layer ceramic capacitor 30 may cover the end surfaces 11a and 11b, respectively, and may also extend to both the side surfaces 11c and 11d and both the main surfaces 11e and 11f. In this case, in either one of the first and second sintered metal films 34 and 35, a cross section parallel to an X-Z plane and a cross section parallel to an X-Y plane have a U-shape.

Figure 10:
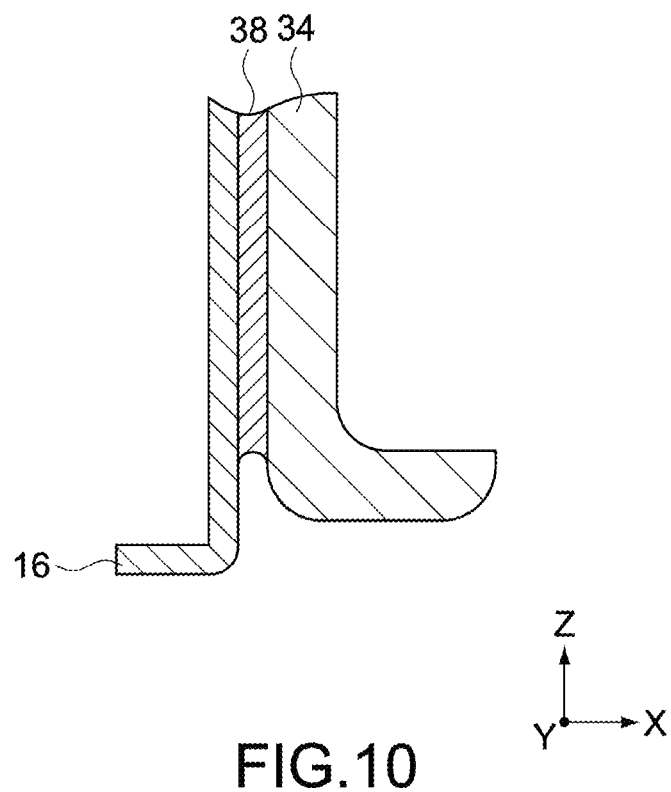
FIG. 10 is a partially enlarged view of FIG. 9.

FIG. 10 is an enlarged view of FIG. 9 and shows a joint portion between the first metal terminal 16 and the first sintered metal film 34. It should be noted that a joint portion between the second metal terminal 17 and the second sintered metal film 35 is also formed in the same manner.

Joint surfaces 34a and 35a, to which the first and second metal terminals 16 and 17 are jointed, are surfaces facing in the X-axis direction in the surfaces of the first and second sintered metal films 34 and 35. The joint surfaces 34a and 35a are subjected to blasting, and thus have the surface roughness Ra of 0.200 μm or less. The solder of alloy joint portions 38 and 39 can wet only the joint surfaces 34a and 35a activated by the blasting.

Figure 11:
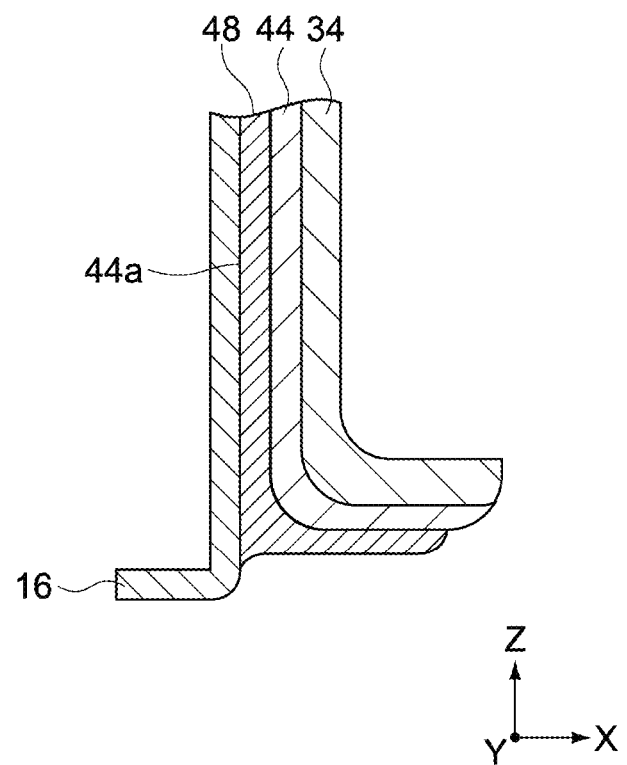
FIG. 11 is an enlarged cross-sectional view of a multi-layer ceramic capacitor according to a comparative example of the embodiment.

FIG. 11 is an enlarged cross-sectional view of a comparative example of this embodiment and shows a configuration in which a plating film 44 is formed on the surface of the first sintered metal film 34 shown in FIG. 9. FIG. 11 also shows an alloy joint portion 48.

As shown in the figure, when the first metal terminal 16 is jointed to the plating film 44 by solder, the solder may wet-spread on surfaces other than a joint surface 44a of the plating film 44, the joint surface 44a facing in the X-axis direction. Specifically, the solder may also wet the surfaces of the plating film 44 that face in the Y- and Z-axis directions. Further, when the metal terminals 16 are jointed, a solder burst may occur, and scattered solder may adhere to parts to which the solder does not adhere under ordinary circumstances.

If the joint surfaces 34a and 35a are subjected to blasting, as shown in FIG. 10, the solder wets only the joint surfaces 34a and 35a that have been subjected to blasting, and the wet spreading of the solder or the solder burst can be inhibited from occurring.

5. Example and Comparative Examples

As Example and Comparative examples of this embodiment, samples of the multi-layer ceramic capacitor 10 were produced on the basis of the production method described above. In those samples, the dimension of the ceramic body 11 in the X-axis direction was set to 10 mm, and the dimensions thereof in the Y- and Z-axis directions were set to 10 mm.

Table 1 shows a method of treating sintered metal films and evaluation results in each of the Example and Comparative examples.

In the samples of the Example 1, the surfaces (joint surfaces 14a and 15a) of the first and second sintered metal films 14 and 15 were subjected to sandblasting. As conditions for sandblasting, the injection media was $Al_2O_3$, and the injection air pressure was 0.2 MPa. The first and second metal terminals 16 and 17 were jointed to the sandblasted joint surfaces 14a and 15a by using high-temperature solder.

In the samples of the Comparative example 1, blasting was not performed on the first and second sintered metal films 14 and 15, and the first and second metal terminals 16 and 17 were jointed to the joint surfaces 14a and 15a by using high-temperature solder.

In the samples of the Comparative example 2, barrel plating was performed on the first and second sintered metal films 14 and 15 as base layers, and the first and second metal terminals 16 and 17 were jointed to the surfaces of the obtained plating films by using high-temperature solder.

TABLE 1

| | Method of treating sintered metal films | Occurrence of chipping | Solder wettability |
|---|---|---|---|
| Example 1 | Blasting | Absent | A |
| Comparative Example 1 | Not applied | Absent | B |
| Comparative Example 2 | Plating | Present | — |

As shown in Table 1, chipping was caused in the plated samples of the Comparative example 2. The samples of the Example 1 and the Comparative example 1, which were not subjected to the plating, did not cause damages of the bodies, such as chipping.

Next, in the samples of the Example 1 and the Comparative example 1, which did not cause damages of the bodies, solder wettability was evaluated for the surfaces of the first and second sintered metal films 14 and 15. Specifically, the samples were loaded to a reflow furnace with solder drops being placed on the surfaces of the first and second sintered metal films 14 and 15, and a contact angle of the molten solder was evaluated. It is already confirmed that when the contact angle of the solder is 135° or more, sufficient joint strength of the metal terminals is obtained. From this regard, when the contact angle was 135° or more, the wettability was determined as "good" (A), and when the contact angle was less than 135°, the wettability was determined as "bad" (B).

The contact angle in the Example 1 was 144°, and the wettability was determined as "good". On the other hand, the contact angle in the Comparative example 1 was 101°, and the wettability was determined as "bad". From those results, it is presumed that proper solder wettability is obtained and good joint strength of the metal terminals is obtained in the Example 1, whereas the solder wettability is bad and the joint strength of the metal terminals is also insufficient in the Comparative example 1.

Further, in the samples of the Example 1 and the Comparative example 1, the surface roughness Ra of the joint surfaces 14a and 15a of the first and second sintered metal films 14 and 15 was measured by using a surface roughness meter. As a result, the surface roughness Ra of the joint surfaces 14a and 15a of the Example 1 was 0.188 whereas the surface roughness Ra of the joint surfaces 14a and 15a of the Comparative example 1 was 0.293 When the surfaces of the first and second sintered metal films 14 and 15 of the Example 1 and the Comparative example 1 were actually observed with a scanning electron microscope (SEM) and an energy dispersive X-ray spectrometry (EDS), a lot of glass surfacing were found in the Comparative example 1, whereas glass surfacing and the like were not found in the Example 1 where only fine liner asperities were found, but the surfaces were almost smooth. It should be noted that when the surface roughness Ra of the joint surfaces 14a and 15a of the first and second sintered metal films 14 and 15 is smaller than 0.015 the luster of the surfaces of the first and second sintered metal films 14 and 15 increases, which results in difficulty in recognition of components by a sensor when the components are handled in an automated machine.

II. Second Embodiment

Figure 12:
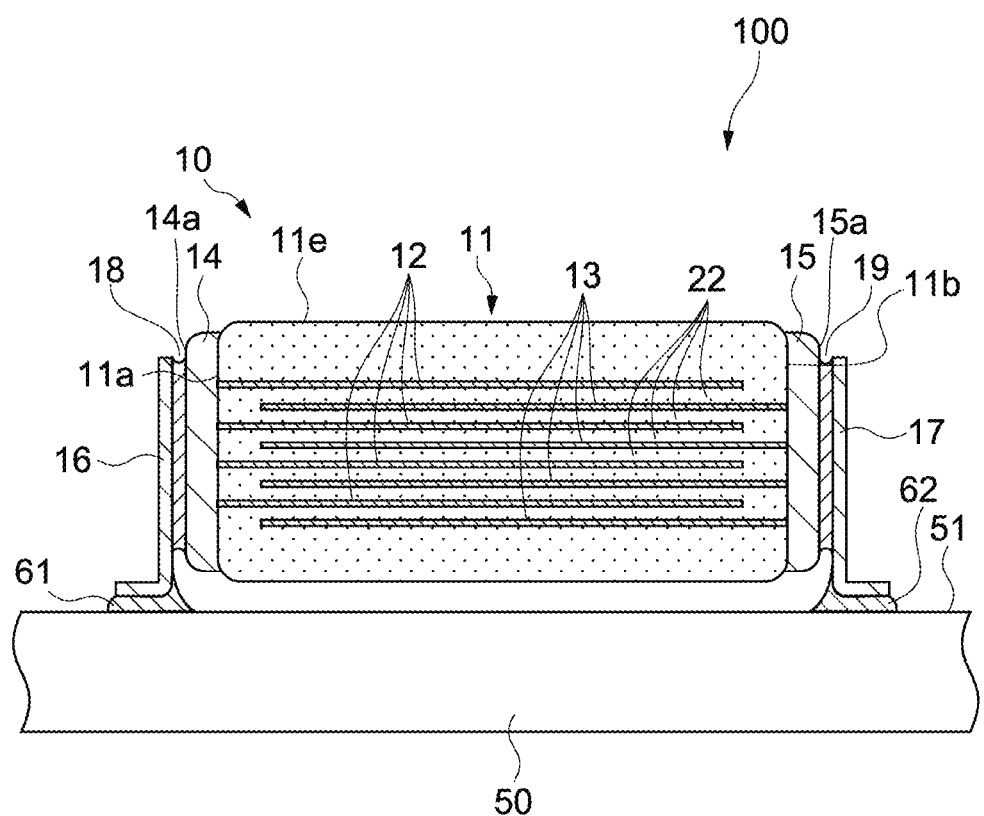
FIG. 12 is a cross-sectional view of an electronic component mounting substrate according to a second embodiment of the present invention.
Figure 12:
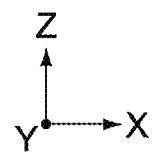

FIG. 12 is a view of an electronic component mounting substrate 100 including a multi-layer ceramic capacitor 10 according to a second embodiment of the present invention, and is also a cross-sectional view in the Y-axis direction, which corresponds to FIG. 2. It should be noted that configurations similar to those in the first embodiment are denoted by the same reference symbols, and detailed description thereof will be omitted.

The electronic component mounting substrate 100 includes a multi-layer ceramic capacitor 10, a circuit substrate 50, a first alloy mount portion 61, and a second alloy mount portion 62.

The circuit substrate 50 is a substrate including various circuit modules, and circuits are formed on at least one of both main surfaces of the circuit substrate 50. The circuit substrate 50 may have a mount surface 51 configured to be capable of mounting the multi-layer ceramic capacitor 10.

The multi-layer ceramic capacitor 10 includes a ceramic body 11, a first sintered metal film 14 having a joint surface 14a, a second sintered metal film 15 having a joint surface 15a, first metal terminals 16, second metal terminals 17, first alloy joint portions 18, and second alloy joint portions 19. The multi-layer ceramic capacitor 10 has the configuration described in the first embodiment. It should be noted that the multi-layer ceramic capacitor 10 of this embodiment may have a configuration similar to that of the multi-layer ceramic capacitor 30 according to the modified example of the first embodiment.

The first and second alloy mount portions 61 and 62 are formed of a first alloy and joint the multi-layer ceramic capacitor 10 and the circuit substrate 50 to each other. The first alloy is an alloy having a melting point lower than, for example, 230° C. Typically, solder is used for the first alloy. Examples of such an alloy include solder having a composition of Sn-3.0Ag-0.5Cu.

The first and second alloy joint portions 18 and 19 are formed of a second alloy having a higher melting point than that of the first alloy. The second alloy may be, for example, high-temperature solder having a melting point of 230° C. or higher, and may be a brazing material containing an alloy mainly containing gold (Au), silver (Ag), copper (Cu), zinc (Zn), aluminum (Al), or the like.

When the multi-layer ceramic capacitor 10 is mounted on the circuit substrate 50, for example, solder formed of the first alloy is applied onto a land (not shown in the figure) formed on the mount surface 51 of the circuit substrate 50. Subsequently, the multi-layer ceramic capacitor 10 is disposed on the circuit substrate 50. At that time, the first and second metal terminals 16 and 17 of the multi-layer ceramic capacitor 10 are disposed on the land to which the solder has been applied. The solder is then melted in a reflow furnace or the like. Subsequently, the circuit substrate 50 is cooled and thus the solder is solidified, so that the first and second alloy mount portions 61 and 62 are formed.

When the solder formed of the first alloy is melted, the multi-layer ceramic capacitor 10 is also heated to a temperature equal to or higher than the melting point of the first alloy. According to this embodiment, since the second alloy of the first and second alloy joint portions 18 and 19 has a higher melting point than that of the first alloy, the first and second alloy joint portions 18 and 19 can be inhibited from being melted at the time of the heating described above.

III. Other Embodiments

Hereinabobve, the embodiments of the present invention have been described, but the present invention is not limited to the embodiments described above, and it should be appreciated that the present invention may be variously modified without departing from the gist of the present invention. For example, the embodiments of the present invention can be an embodiment in which the embodiments are combined.

In the above embodiments, the blasting has been described as an example of the surface treatment for setting the surface roughness Ra of the joint surfaces 14a and 15a to be 0.200 μm or less. However, other polishing treatment such as mechanical polishing or chemical polishing may be used.

For example, in the multi-layer ceramic capacitor 10, the capacitance forming unit 20 may be divided into a plurality of capacitance forming units 20 and then disposed in the Z-axis direction. In this case, in each capacitance forming unit 20, the first and second internal electrodes 12 and 13 only need to be alternately disposed along the Z-axis direction, and the first internal electrodes 12 or the second internal electrodes 13 may be consecutively disposed at portions where the capacitance forming units 20 are adjacent to each other.

Further, in the embodiments described above, the multi-layer ceramic capacitor has been described as an example of a ceramic electronic component, but the present invention can be applied to any other multi-layer ceramic electronic components in which paired internal electrodes are alternately disposed. Examples of such multi-layer ceramic electronic components include a piezoelectric element.

What is claimed is:

1. An electronic component mounting substrate, comprising:
   a ceramic electronic component;
   a circuit substrate on which the ceramic electronic component is mounted;
   a first alloy mount portion that is formed of a first alloy and joints the ceramic electronic component and the circuit substrate to each other; and
   a second alloy mount portion that is formed of the first alloy and joints the ceramic electronic component and the circuit substrate to each other and is arranged separated from the first alloy mount portion in a first axis direction,
   the ceramic electronic component including
      a ceramic body that includes first internal electrodes, second internal electrodes, a first end surface facing in the first axis direction, and a second end surface facing in the opposite direction as the first end surface,
      a first sintered metal film that has a first joint surface having a surface roughness Ra of 0.200 μm or less, the first sintered metal film being connected to the first internal electrodes and formed on only the first end surface of the ceramic body, the first sintered metal film containing metal as a main component and glass,
      a second sintered metal film that has a second joint surface having a surface roughness Ra of 0.200 μm or less, the second sintered metal film being connected to the second internal electrodes and formed on only the second end surface of the ceramic body, the second sintered metal film containing metal as a main component and glass,
      plural first metal terminals that are each jointed to the first joint surface and each jointed to the circuit substrate by the first alloy mount portion,
      plural second metal terminals that are each jointed to the second joint surface and each jointed to the circuit substrate by the second alloy mount portion,
      plural first alloy joint portions that are formed of a second alloy having a melting point higher than a melting point of the first alloy and joint the first joint surface and the first metal terminals to each other, and
      plural second alloy joint portions that are formed of the second alloy and joint the second joint surface and the second metal terminals to each other,
   wherein the second alloy is formed of solder,
   wherein the plural first metal terminals are arrayed on the first joint surface along a second axis direction orthogonal to the first axis direction so as to be separated independently from each other, wherein the plural second metal terminals are arrayed on the second joint surface along the second axis direction so as to be separated independently from each other, wherein the first alloy joint portions are separated independently from each other and are formed so as to respectively correspond to each of the first metal terminals, wherein the second alloy joint portions are separated independently from each other and are formed so as to respectively correspond to each of the second metal terminals, wherein each of the plural first metal terminals includes a single surface that is jointed to each of the first alloy joint portions, a single substrate joint portion that is jointed to the first alloy mount portion, and a single bent portion that is located between the single surface and the single substrate joint portion, wherein each of the plural second metal terminals includes a single surface that is jointed to each of the second alloy joint portions, a single substrate joint portion that is jointed to the second alloy mount portion, and a single bent portion that is located between the single surface and the single substrate joint portion, wherein the single surface of each first metal terminal and each second metal terminal extends in a third axis direction orthogonal to the first axis direction and the second axis direction, and wherein the single bent portion of each first metal terminal and each second metal terminal bends outward in the first axis direction.

2. The electronic component mounting substrate according to claim 1, wherein the second alloy has a melting point of 230° C. or higher.

3. The electronic component mounting substrate according to claim 2, wherein the second alloy contains Sn as a main component and at least one of Sb, Ag, Cu, and Ni.

4. An electronic component mounting substrate, comprising:
- a ceramic electronic component;
- a circuit substrate on which the ceramic electronic component is mounted;
- a first alloy mount portion that is formed of a first alloy and joints the ceramic electronic component and the circuit substrate to each other; and
- a second alloy mount portion that is formed of the first alloy and joints the ceramic electronic component and the circuit substrate to each other and is arranged separated from the first alloy mount portion in a first axis direction,
the ceramic electronic component comprising:
- a ceramic body that includes first internal electrodes, second internal electrodes, a first end surface facing in the first axis direction and a second end surface facing in the opposite direction as the first end surface,
- a first sintered metal film that has a first joint surface having a surface roughness Ra of 0.190 μm or less, the first sintered metal film being connected to the first internal electrodes and formed on only the first end surface of the ceramic body, the first sintered metal film containing metal as a main component and glass,
- a second sintered metal film that has a second joint surface having a surface roughness Ra of 0.190 μm or less, the second sintered metal film being connected to the second internal electrodes and formed on only the second end surface of the ceramic body, the second sintered metal film containing metal as a main component and glass,
- plural first metal terminals that are each jointed to the first joint surface and each jointed to the circuit substrate by the first alloy mount portion,
- plural second metal terminals that are each jointed to the second joint surface and each jointed to the circuit substrate by the second alloy mount portion,
- plural first alloy joint portions that are formed of a second alloy having a melting point higher than a melting point of the first alloy and joint the first joint surface and the first metal terminals to each other, and
- plural second alloy joint portions that are formed of the second alloy and joint the second joint surface and the second metal terminals to each other, wherein the second alloy is formed of solder, wherein the plural first metal terminals are arrayed on the first joint surface along a second axis direction orthogonal to the first axis direction so as to be separated independently from each other, wherein the plural second metal terminals are arrayed on the second joint surface along the second axis direction so as to be separated independently from each other, wherein the first alloy joint portions are separated independently from each other and are formed so as to respectively correspond to each of the first metal terminals, wherein the second alloy joint portions are separated independently from each other and are formed so as to correspond to each of the second metal terminals, wherein each of the plural first metal terminals includes a single surface that is jointed to each of the first alloy joint portions, a single substrate joint portion that is jointed to the first alloy mount portion, and a single bent portion that is located between the single surface and the single substrate joint portion, wherein each of the plural second metal terminals includes a single surface that is jointed to each of the second alloy joint portions, a single substrate joint portion that is jointed to the second alloy mount portion, and a single bent portion that is located between the single surface and the single substrate joint portion, wherein the single surface of each first metal terminal and each second metal terminal extends in a third axis direction orthogonal to the first axis direction and the second axis direction, and wherein the single bent portion of each first metal terminal and each second metal terminal bends outward in the first axis direction.

* * * * *